(12) United States Patent
Atallah et al.

(10) Patent No.: US 6,330,296 B1
(45) Date of Patent: Dec. 11, 2001

(54) DELAY-LOCKED LOOP WHICH INCLUDES A MONITOR TO ALLOW FOR PROPER ALIGNMENT OF SIGNALS

(75) Inventors: Francois Ibrahim Atallah, Raleigh; George Diniz, Liberty; James Norris Dieffenderfer, Apex; David John Seman, Cary, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/097,130

(22) Filed: Jun. 12, 1998

(51) Int. Cl.[7] ..................................................... H03D 3/24
(52) U.S. Cl. ........................... 375/376; 375/374; 327/159
(58) Field of Search ..................................... 375/373, 374, 375/375, 376, 215, 294; 327/147, 148, 149, 150, 151, 152–161, 536; 329/307, 309, 325, 360

(56) References Cited

U.S. PATENT DOCUMENTS

| 5,151,665 | 9/1992 | Wentzler | 331/8 |
|---|---|---|---|
| 5,600,272 | 2/1997 | Rogers | 327/157 |
| 5,623,523 | 4/1997 | Gehrke | 375/376 |
| 5,651,035 | 7/1997 | Tozun et al. | 375/373 |
| 5,661,419 | 8/1997 | Bhagwan | 327/8 |
| 5,663,665 | 9/1997 | Wang et al. | 327/3 |
| 5,877,656 * | 3/1999 | Mann et al. | 331/16 |
| 5,959,478 * | 9/1999 | Ciccone et al. | 327/157 |
| 5,999,353 * | 12/1999 | Hase et al. | 360/51 |
| 6,037,806 * | 3/2000 | Smith et al. | 327/47 |
| 6,057,739 * | 5/2000 | Crowley et al. | 331/14 |
| 6,064,947 * | 5/2000 | Sun et al. | 702/106 |

* cited by examiner

Primary Examiner—Chi Pham
Assistant Examiner—Emmanuel Bayard
(74) Attorney, Agent, or Firm—Sawyer Law Group LLP

(57) ABSTRACT

The present invention provides a delay-locked loop (DLL). The DLL comprises a phase-frequency detector (PFD) for receiving a reference signal. The DLL further includes a charge pump which is coupled to the PFD. The DLL also includes a loop filter which is coupled to the charge pump and the PFD. Additionally in the DLL, delay line means is coupled to the charge pump and the loop filter. The delay line means provides a feedback signal to the PFD. The DLL further includes monitor means coupled to the PFD, the charge pump and the loop filter. The monitor means is for detecting when a voltage across the loop filter is at a predetermined level, wherein when the voltage is at the predetermined level the monitor means causes the PFD to enter a pump-down mode until the feedback signal is aligned with the reference signal. An advantage of the present invention is that DLL loop tracking failures based upon a stuck condition are reliably avoided. Specifically, the DLL in accordance with the present invention can reliably recover from the stuck condition in which the adjustable delay is at its lower limit and the PFD asserts the UP control signal. Additionally, the DLL is cost effective and is easily implemented utilizing existing processes.

19 Claims, 4 Drawing Sheets

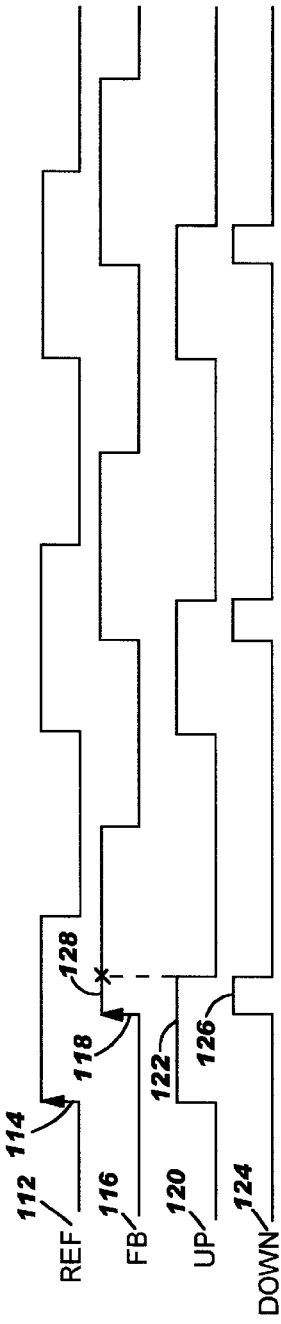
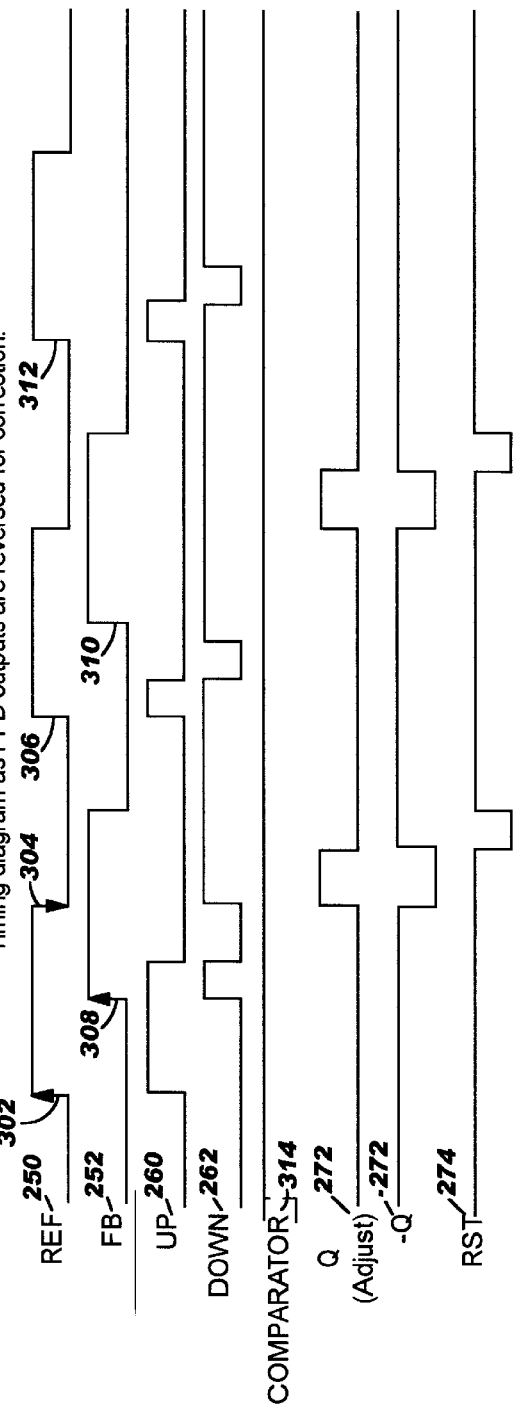

Timing Diagram for Critical delays.
Note: tpPR = tpR

DELAY-LOCKED LOOP WHICH INCLUDES A MONITOR TO ALLOW FOR PROPER ALIGNMENT OF SIGNALS

FIELD OF THE INVENTION

The present invention relates generally to signal skew corrections in signal generation circuits and more particularly to delay-locked loops which include a phase-frequency detector.

BACKGROUND OF THE INVENTION

Signal generation circuits have traditionally employed phase-locked loop (PLL) circuits to produce signals which are synchronized with an external reference signal. Alternatively, delay-locked loops (DLL) have been utilized to provide for signal skew corrections in signal generation circuits, particularly clock generation circuits.

A conventional DLL is configured as a feedback loop for tracking and controlling the signal skew. The conventional DLL typically comprises a phase-frequency detector (PFD) to compare a signal with an external reference signal. The conventional DLL also includes a voltage controlled delay line (VCDL) for receiving an input signal and providing the signal, wherein the signal is responsive to the input signal. The input signal, typically a clock signal, may be derived from the external or a system-wide reference signal. The VCDL has an adjustable signal propagation delay that varies between an upper and a lower limit as a function of a control voltage, whereby, relative to the input signal, the signal output from the VCDL is delayed by the adjustable delay.

In this case, the reference signal and the output signal have the same frequency and a relative phase shift equal to the adjustable delay. This phase shift can also be described in terms of a signal timing skew or simply the signal skew. The adjustable delay between these signals is relative since, in a given time period, the rising (or falling) edge of one signal precedes (or lags) the rising (or falling) edge of the other.

In operation, the PFD compares the reference signal and the signal output from the VCDL which is provided to the PFD through a feedback path. In response, the PFD provides one or both of "Up" and "Down" control signals having an active duration representative of the phase difference between the signals being compared. In other words, the PFD tracks the phase difference and the loop gradually reduces the timing skew between the reference signal and the signal output from the VCDL until they become more closely synchronized, that is, their respective rising edges are more closely aligned. Hence, the DLL performs a "loop tracking" function. When alignment between the rising edge of the reference signal and the output signal is achieved, the signals are synchronized and the DLL is said to be "locked".

When, for instance, a system comprising the DLL "recovers" from a sleep or power-conservation mode, the control voltage may initially be at or close to its lower limit. In this case the VCDL may produce an adjustable delay equal or substantially close to its upper limit. When the adjustable delay provided by the VCDL is below one clock period and the PFD is in a "pump up" mode, the loop will cause the control voltage to increase, thus speeding of the delay through the VDCL. However, the only way the signals could be aligned is if the delay is zero. Since this situation is impossible, the VCDL may become stuck at an always high state causing the PFD to also get "stuck". Under this circumstances the DLL loop tracking fails.

A conventional DLL is disclosed in U.S. Pat. No. 5,661,419 to Raghunand Bhagwan (Bhagwan), avoids the DLL loop tracking failure when the adjustable delay provided by the VCDL is at its upper limit. Bhagwan discloses keeping the Up signal active during the time in which the VCDL is stuck, thereby permitting the VCDL to regulate the adjustable delay so that, for example, during transition from the sleep mode to normal operation mode, the adjustable delay is decreased in a predictably short time. However, conventional PFDs, including the one above-described, may also get stuck when the adjustable delay is at its lower limit while the PFD is still asserting the Up control signal.

Accordingly, what is needed is a DLL which avoids the above-identified stuck conditions. Particularly, a DLL is needed that can recover from the stuck condition in which the adjustable delay is at its lower limit and the PFD asserts the UP control signal. The DLL needs to be cost effective and easily implemented utilizing existing processes. Finally, the DLL needs to behave reliably. The present invention addresses such needs.

SUMMARY OF THE INVENTION

The present invention provides a delay-locked loop (DLL). The DLL comprises a phase-frequency detector (PFD) for receiving a reference signal. The DLL further includes a charge pump which is coupled to the PFD. The DLL also includes a loop filter which is coupled to the charge pump and the PFD. Additionally in the DLL, delay line means is coupled to the charge pump and the loop filter. The delay line means provides a feedback signal to the PFD. The DLL further includes monitor means coupled to the PFD, the charge pump and the loop filter. The monitor means is for detecting when a voltage across the loop filter is at a predetermined level, wherein when the voltage is at the predetermined level the monitor means causes the PFD to enter a pump-down mode until the feedback signal is aligned with the reference signal.

An advantage of the present invention is that DLL loop tracking failures based upon a stuck condition are reliably avoided. Specifically, the DLL in accordance with the present invention can reliably recover from the stuck condition in which the adjustable delay is at its lower limit and the PFD asserts the UP control signal. Additionally, the DLL is cost effective and is easily implemented utilizing existing processes.

BRIEF DESCRIPTION OF THE DRAWINGS

FIG. 2 is a timing diagram illustrating the phase-frequency detector of FIG. 1 in a stuck condition.

FIG. 4 is a timing diagram illustrating the functionality of a DLL configured in accordance with the present invention in which a phase frequency detector (PFD) correction is introduced.

DETAILED DESCRIPTION OF THE INVENTION

The present invention relates generally to signal skew corrections in signal generation circuits and more particularly to delay-locked loops which include a phase-frequency detector. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 1:
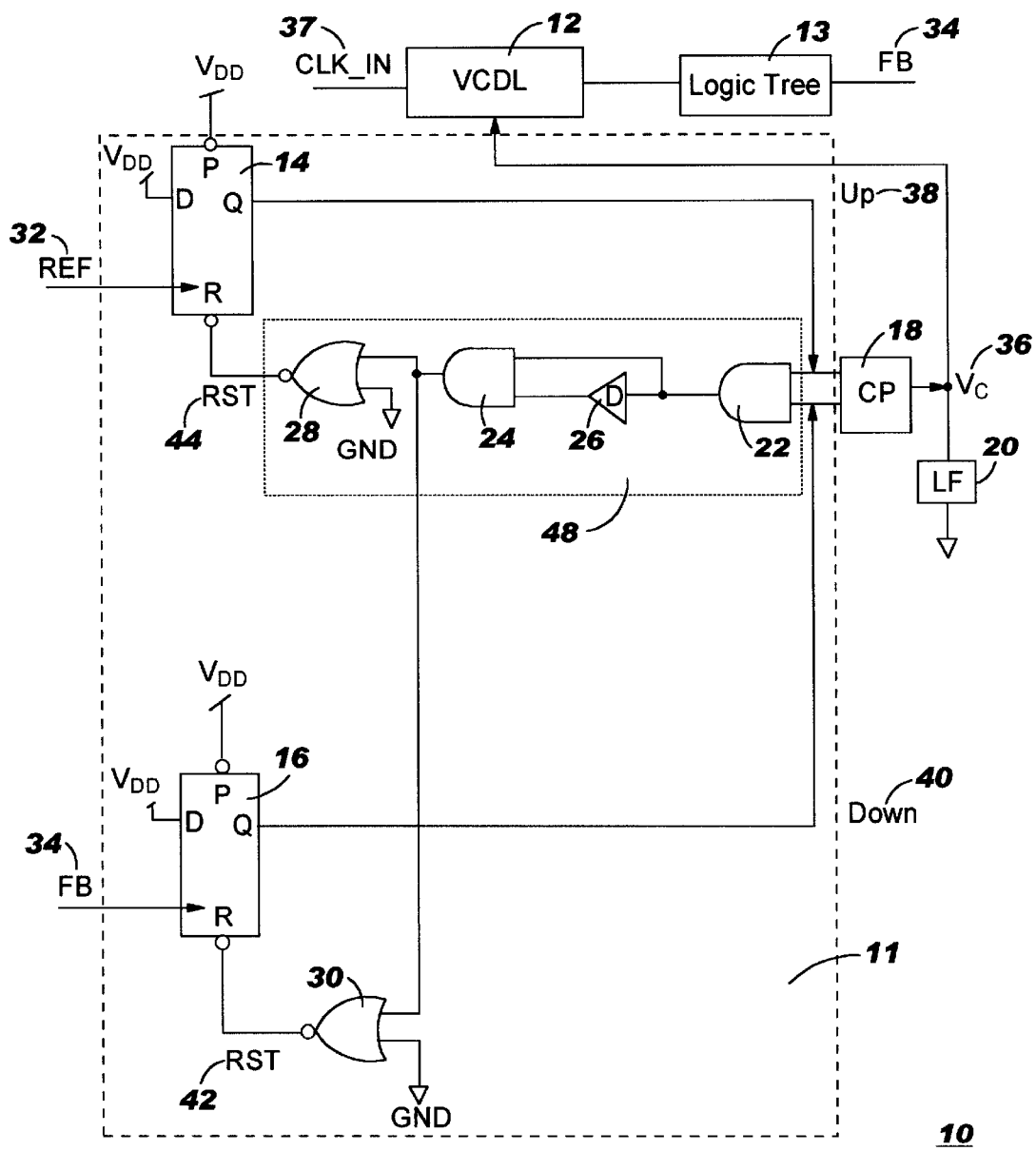
FIG. 1 is a block diagram illustrating a conventional delay-locked loop.

Referring now to FIG. 1. FIG. 1 is a block diagram illustrating a conventional delay-locked loop (DLL). A conventional DLL 10 comprises a feedback loop for tracking and controlling the signal skew. The DLL 10 includes a voltage controlled delay line (VCDL) 12 and a loop filter 20. The VCDL 12, provides an adjustable delay that varies as a function of a control voltage (Vc) 36 across the loop filter 20. An additional non-adjustable propagation delay is provided by a logic tree 13 which is coupled to the VCDL 12. Accordingly, an input (CLK_IN) signal 37 which passes through the VCDL 12 and the logic tree 13 provides a delayed output (FB) signal 34. The delay of the FB signal 34 is also adjustable (adjustable delay) and is equal to a sum of the adjustable delay and the propagation delay. The adjustable delay of the FB signal 34 varies between an upper limit and a lower limit as a function of the control voltage 36. Typically, the CLK_IN 37 is derived from an external or a system-wide reference (REF) signal 32.

The conventional DLL 10 further includes a phase frequency detector (PFD) 11. The PFD 11 includes a state machine comprising a pair of D-flip-flops (DFF) 14 and 16 and a combinational logic 48. The combinational logic 48 comprises a pair of dual-input AND (AND) gates 22 and 24 and a pair of dual-input NOR (NOR) gates 28 and 30. The AND gates 22 and 24 are coupled to each other via a delay buffer 26. The AND gate 24 is coupled to each of the NOR gates 28 and 30. The NOR gates 28 and 30 are coupled to the DFFs 14 and 16, respectively.

In addition, the conventional DLL 10 includes a charge pump 18. The charge pump 18 is coupled to the loop filter 20 and to the VCDL 12, forming a control path part of the feedback loop. The charge pump 18 is coupled also to the PFD 11. The VCDL 12 is coupled to the PFD 11 through the logic tree 13, forming a feedback path part (feedback path) of the feedback loop. Thus, the PFD 11 receives in one input, at DFF 14, the REF signal 32 and in a second input, at DFF 16, the FB signal 34 through the feedback path.

It is well known that the DLL 10 utilizes the PFD 11 to correct a timing skew of two signals having the same frequency. Typically, the PFD 11 tracks and gradually reduces the timing skew between the reference (REF) signal 32 and the FB signal 34 until they become more closely synchronized, that is, their respective rising edges are more closely aligned. Hence, the DLL 10 performs a "loop tracking" function.

The timing skew is manifested as a relative phase shift between the REF signal 32 and the FB signal 34 that is proportional to a deviation from synchronization of the REF signal 32 and the FB signal 34. This deviation from synchronization is determined by the above-mentioned adjustable delay of the FB signal 34, wherein the relative phase shift or timing skew is equal to the adjustable delay. When the adjustable delay is at minimum the phase shift is at minimum and the rising edges of the REF and FB signals 32 and 34 are closely aligned.

In a first instance, when the rising edge of the REF signal 32 leads the rising edge of the FB signal 34, the REF signal 32 is said to be "leading" while the FB signal 34 is said to be "lagging" by a period equal to the adjustable delay. In a second instance, the opposite may be true. Thus, in any given time period, a rising (or falling) edge of one of the REF and the FB signals 32 and 34 leads (or lags) a rising (or falling) edge of the other of these signals, hence the "relative" phase shift.

In operation, the PFD 11 receives both the REF signal 32 and the FB signal 34 for comparison. The PFD 11 provides one or both of an "Up" control signal 38 and a "Down" 40 control signal having an active duration representative of the REF and FB signals alignment deviation. When the REF and FB signals 32 and 34 are not substantially aligned, the REF signal 32 either leads or lags the FB signal 34.

Thus, when the rising edge of the REF signal 32 leads the rising edge of the FB signal 34, the Up control signal 38 at the output Q of the DFF 14 is asserted first. Next, upon the rising edge of the FB signal 34, the Down control signal 40 at the output Q of the DFF 16 is asserted. The Up and Down control signals 38 and 40 are negated (to logic "0") via a reset (RST) signal 44 and 42, respectively, after a reset delay period provided by delay buffer 26 following the rising edge of the FB signal 34.

It is well known that the reset delay is provided in order to preclude a premature reset of the DFFs 14 and 16, respectively. The premature reset introduces a condition known as a "dead zone" within which the respective pulse widths of the Up and Down control signals 38 and 40 are insufficiently wide to effectively activate the charge pump 18 and produce proper locking, thereby causing a phase jitter.

It should be understood that, even though the propagation delay through the combinational logic 48 as a whole determines the reset delay, the reset delay is determined primarily by the delay buffer 26. Thus, although the reset delay is described herein in terms of delay buffer 26, in effect, it represents the propagation delay through the combinational logic 48.

The RST signals 44 and 42 are asserted (logic "0"), upon lapse of the reset delay, when both inputs to the AND gate 22 are at logic "1" (asserted). That is, a reset occurs when both the Up and Down control signals 38 and 40 are asserted. The width of the Up control signal 38 is proportional to the alignment deviation of the REF and FB signals 32 and 34.

Alternatively, when the rising edge of the REF signal 32 lags behind the rising edge of the FB signal 34, the Down control signal 40 at the output Q of the DFF 16 is asserted first. Next, upon the rising edge of the REF signal 32, the Up control signal 38 at the output Q of the DFF 14 is asserted. The Up and Down control signals 38 and 40 are likewise negated (to logic "0") via a reset (RST) signal 44 and 42, respectively, after a reset delay period provided by delay buffer 26 following the rising edge of the REF signal 32. In this case, the width of the Down control signal 40 is proportional to the alignment deviation of the REF and FB signals 32 and 34. In both scenarios, the negation of the Up and Down control signals 38 and 40 is substantially coincidental because the RST signals 44 and 42, respectively, are received substantially simultaneously.

Also in operation, when achieving alignment between the rising edges of the REF signal 32 and the FB signal 34, respectively, the DLL 10 is said to be "locked." Hence, the PFD 11 tracks the phase difference or timing skew between REF and the FB signals 32 and 34 by repeatedly asserting and negating the Up and Down control signals 38 and 40 with each succeeding set of rising edges of the REF and FB signals 32 and 34, respectively, until a lock point is found. During loop tracking, the charge pump 18 receives the Up and Down control signals 38 and 40 from the PFD 11 for activating the charging and discharging of the loop filter 20. This, in turn controls the above-mentioned adjustable delay.

The loop tracking gradually varies the adjustable delay and reduces the timing skew so that the REF and FB signals 32 and 34 become more closely aligned, that is, their respective rising edges are more closely aligned. When then FB and the REF signals 32 and 34 are closely aligned, the duration of the Up or Down control signals 38 and 40 in an asserted state is at it lowest value and their pulse width is the narrowest, except that a further narrowing is prevented by the reset delay in order to preclude the phase jitter. When performing a one-cycle lock, an adjustable delay equal to at least one cycle of the REF signal 32 allows alignment of the rising edges of the REF signal 32 and the FB signal 34, respectively. Other types of cycle lock, such as half-cycle lock may impose a different delay value requirements.

Initially, upon power-up or upon transition from sleep mode to normal operation mode, the adjustable delay may be at or close to its higher limit. As a result, the VCDL 12 may become stuck in one state and, in turn, the DLL loop tracking may fail.

In order for the DLL 10 to lock onto the earliest lock point without first getting stuck, the control voltage 36 across the loop filter 20 is set to a value higher than zero volts (a voltage substantially close to the supply voltage VDD, e.g., 1.5 to 2.2 volts in a 3.3 volts supply environment). As illustrated, control voltage 36 is a voltage measured across the loop filter 20 and, as mentioned, it is used to control the adjustable delay (i.e., the VCDL 12). Then the DLL loop tracking commences for a gradual reduction of the control voltage 36 until an appropriate lock point is reached.

However, if the rising edge of the REF signal 32 leads the rising edge of the FB signal 34, the PFD 11 provides an Up control signal 38, thereby attempting to reduce the adjustable delay wherein, by reason of control voltage 36 being initially high, the adjustable delay has already reached its lower limit and the VCDL 12 is otherwise "saturated". These conditions can results in the PFD 11 getting stuck in a "pump-up" mode. The PFD 11 getting stuck may also occur if, during DLL loop tracking in normal operating mode, the adjustable delay has reached its lower limit while the PFD 11 is still providing the Up control signal 38. These conditions are described in more detail below in conjunction with FIG. 2.

FIG. 2 is a timing diagram illustrating the PFD 11 of FIG. 1 in a "stuck condition." In this instance, the REF signal 112 leads the FB signal 124. Upon arrival of the rising edge 114 of the REF signal 112, the Up control signal 120 is asserted (to a logic "1"). Upon arrival next of the rising edge 118 of the FB signal 114, the Down control signal 124 is asserted. Upon lapse of the reset delay 128, both the Up control signal 120 and the Down control signal 124 are negated.

In this sequence, the Up control signal 120 has a pulse width 122 in the asserted state that is wider than the pulse width 126 of the Down control signal 124 in the asserted state. Hence the pump-up mode occurs for a longer period of time than the pump-down mode. In fact, if the Down signal 124 pulse width 126 is too short to effectively activate the charge pump (18 FIG. 1) for discharging the loop filter (20), the pump-down mode may not even begin. Accordingly, successive periods of pump-up mode without effective periods of pump-down mode lead to saturation of the VCDL 12 and cause the PFD 11 to become stuck.

However, even if the pump-down mode becomes active, its duration is small by comparison to the pump-up mode duration when the REF signal 112 leads the FB signal 114. It follows that, while the REF signal 112 continues to lead, the adjustable delay may rapidly reach its lower limit before a lock point is found, i.e., before alignment of the REF and FB signals 32 and 34 is achieved. In this case, the VCDL 12 may become saturated and, in turn, the PFD may become stuck.

Although conventional DLLs may prevent the stuck condition from occurring when the adjustable delay is close to or at its upper limit, known conventional DLLs do not prevent the stuck condition from occurring when the adjustable delay is close to or at its lower limit. The present invention is directed towards avoiding both of the above-mentioned stuck conditions. Typically, the former stuck condition materializes during power-up and transition from sleep mode to normal operation mode when, initially, the voltage controlling the VCDL starts at zero volts. This condition can be prevented by initially setting the control voltage to a level higher than zero volts. The latter stuck condition occurs during the power-up and transition from sleep mode to the normal operations mode, as well as, during the normal operations mode when, conversely, the control voltage is substantially higher than zero volts (i.e., close to or at its upper limit, e.g. 2.2 volts in a 3.3 volts environment) when the VCDL is saturated.

A key feature of the present invention is that a high voltage level across the loop filter which in a preferred embodiment is a capacitor is an indication that the VCDL is becoming saturated and the PFD is in a stuck condition. Thus, the stuck condition can be detected by monitoring the control voltage across the loop filter. When this stuck condition is detected then a monitor circuit is utilized to restore the loop tracking.

Figure 3:
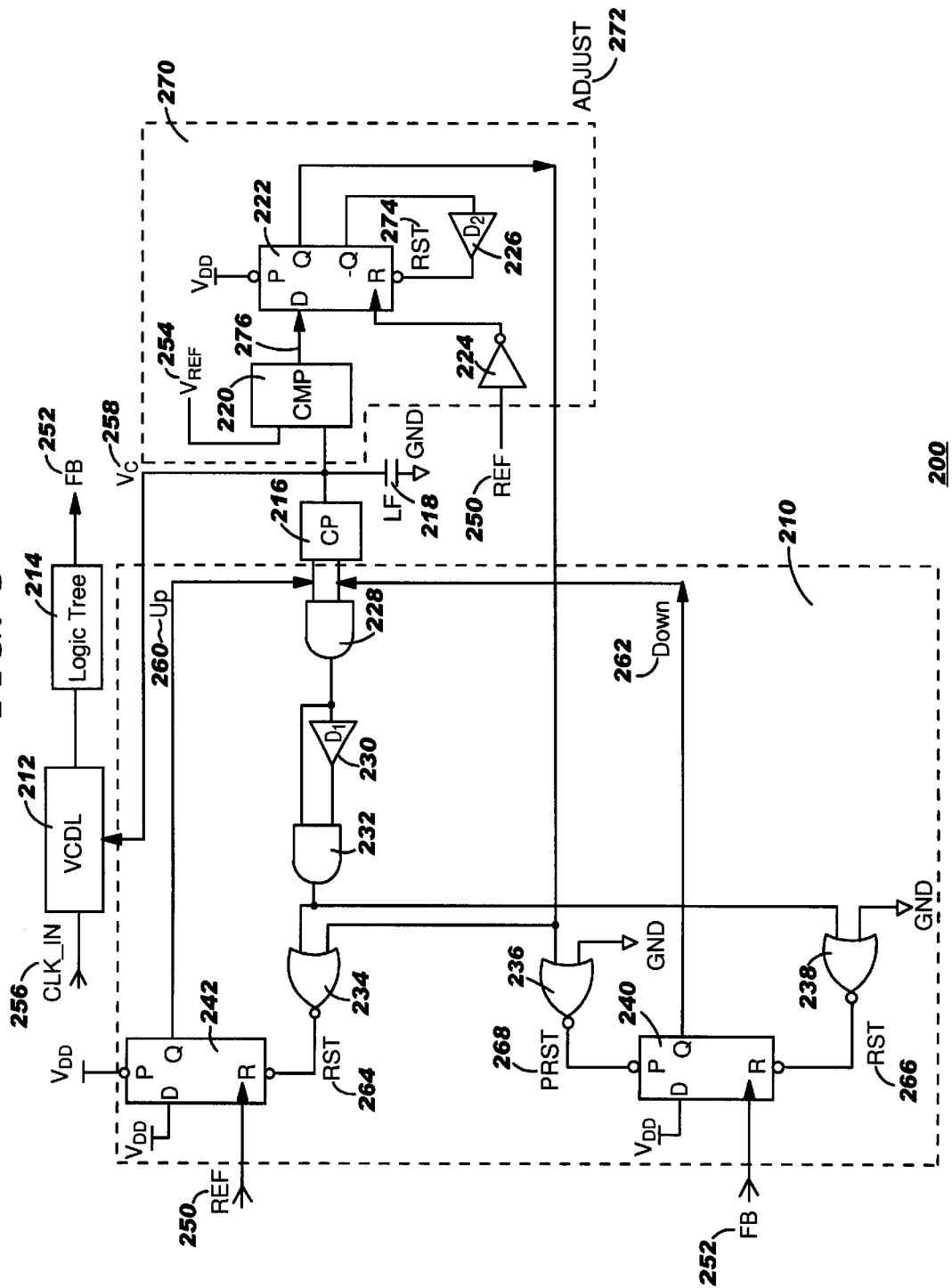
FIG. 3 is a block diagram illustrating a delay-locked loop (DLL) configured in accordance with the present invention.

Accordingly, unlike conventional DLL as above-described, a DLL in accordance with the present invention includes means for detecting and correcting the stuck condition when the adjustable delay is at its lower limit. FIG. 3 is a block diagram illustrating a DLL 200 configured in accordance with the present invention.

It should be understood that different embodiments may utilize different or equivalent components to implement the DLL 200 without departing from the scope and spirit of the present invention. It is further understood that such components may require and/or produce signals having logic states different than those described herein above and below.

As illustrated in FIG. 3, the DLL 200 comprises a feedback loop. The DLL 200 includes a monitor circuit 270 for detecting and correcting the stuck condition. The DLL 200 also includes a PFD 210 which is coupled to the monitor circuit 270. The DLL 200 also includes conventional components as those shown in FIG. 1—that is, a VCDL 212, a logic tree 214, a charge pump 216, and a loop filter 218.

The PFD 210 includes components similar to the components of the PFD 110 in the conventional DLL 100 of FIG. 1. That is, the PFD 210 includes a pair of AND gates 228 and 232, a pair of NOR gates 234 and 238, a pair of DFFs 240 and 242, and a delay buffer 230. In addition to these components, the PFD 210 includes a dual-input NOR (NOR) gate 236 for coupling the PFD 210 with the monitor circuit 270.

The monitor circuit 270 comprises a detector, preferably a comparator 220, which monitors the control voltage 258 and, by comparing the control voltage 258 to a reference voltage (Vref) 254, detects an onset of the stuck condition.

The Vref 254 is set to a level equal to or just below the predetermined level which, as before explained, is in a preferred embodiment the level at which the VCDL 212 is saturated. Preferably, the Vref 254 is set to the level just below the predetermined level (e.g., 2.2 volts in a 3.3 volts environment). The comparator 220 is coupled to a DFF 222 for providing to the DFF 222 a signal 276 indicating the onset of the stuck condition. In turn, the DFF 222 is coupled to an inverter (INV) 224 which is used to affect a synchronous adjustment of the PFD 210 by responding to a falling edge of the REF signal 250. The duration of the adjust signal 272 is determined by a delay buffer 226.

In operation, the comparator 220 monitors the control voltage 258 by comparing the control voltage 258 to the Vref 254. When the DLL loop tracking is about to fail because the VCDL 212 is becoming saturated, the control voltage 258 is at the predetermined level and the PFD 210 is in the pump-up mode, that is, the Up control signal 260 is asserted. The comparator 220 detects this condition and asserts the signal 276 indicating the stuck condition. In this configuration, the asserted signal 276 is at a logic "1".

The signal 276 from the comparator 220 is used to affect a synchronous adjustment of the PFD 210 when it enters or is about to enter the stuck condition. The synchronous adjustment is synchronized with the falling edge of the REF signal 250 which is fed to the DFF 222 through INV 224. The INV 224 inverts the falling edge to a rising edge at the input of the DFF 222. Hence, when the control voltage 258 is at the predetermined level, the falling edge of the REF signal 250 triggers the DFF 222 and causes assertion of the adjust signal 272 at the output (Q) of the DFF 222. In this configuration, the adjust signal 272 is at logic "1" when asserted.

As long as the adjust signal 272 remains at logic "1", DFF 240 receives a preset (PRST) signal 268 (logic "0") through the NOR gate 236. Once the NOR gate 236 produces the PRST signal 268, the DFF 240 asserts the Down control signal 262 at its output (Q). Substantially simultaneously (assuming propagation delays through similar components are equal), the DFF 242 receives the RST signal 264 which is also responsive to the logic "1" state of the adjust signal 272. As a result, the DFF 242 negates the UP control signal 260 and allows the PFD 210 to revert from the pump-up mode to the pump-down mode, wherein the stuck condition is prevented or corrected.

At this point, once the PFD 210 reverts to the pump-down mode for correction, the Up control 260 signal is negated (logic "0") and the Down control signal 262 is asserted (logic "1"). With the Down control signal 262 being asserted, the charge pump 216 discharges the loop filter 218 and lowers the control voltage 258 across the loop filter 218. The PFD 210 maintains the pump-down mode until the Down control signal 262 is again negated. The above identified DLL 200 operation sequence is described in more detail with the following discussion in conjunction with FIGS. 3 and 4.

FIG. 4 is a timing diagram illustrating the functionality of the DLL 200 in accordance with the present invention in which the PFD 210 correction is introduced, the PFD 210 correction being performed by the monitor circuit 270. Upon arrival of the rising edge 302 of the REF signal 250, the Up control signal 260 is then asserted. Upon arrival next of the rising edge 312 the FB signal 252, the Down control signal 262 is asserted. After the reset delay provided by the delay buffer 230, both the Up and Down control signals 260 and 262 are negated. When the PFD 210 is or is about to enter the stuck condition due to the VCDL 212 becoming saturated, the comparator 220 detects this stuck condition and produces a logic "1" 314 at its output (signal 276).

Since the synchronous adjustment is synchronized with the falling edge 304 of the REF signal 250, upon arrival next of the falling edge 304, the adjust signal 272 is asserted. The asserted adjust signal 272 causes a preset of the DFF 240 and assertion of the Down control signal 262, thereby causing the PFD 210 to enter the pump-down mode. The adjust signal 272 stays asserted for a duration of the preset delay (not shown). Upon lapse of the preset delay, the RST 274 causes the adjust signal 272 to be negated. During this period, from the time the adjust signal 272 was asserted and even after it is negated, the Down control signal 262 stays asserted maintaining the PFD 210 in the pump-down mode.

Upon the next arrival of the rising edge 306 of the REF signal 250, the Up control signal 260 is asserted for a short duration. Next, after the reset delay (not shown) the Up and Down signals 260 and 262 are both negated. Upon the arrival next of the FB signal 252 rising edge 310, the Down control signal 262 is asserted and the pump-down mode resumes, and it will continue until the next REF signal 250 rising edge 312. As illustrated, the pulse width of the Down control signal 262 is wider than the pulse width of the Up control signal 260. Therefore, there is sufficient time to effectively discharge the loop filter 218 and reduce the control voltage 258. This process repeats until the lock point is found where the REF and the FB signals 250 and 252 are substantially aligned.

In order to prevent a premature negation of the Down control signal 262, the preset delay provided to the PRST signal 268 by the delay buffer 226 must be longer than the reset delay provided to the RST signal 266 by the delay buffer 230. If the preset delay is not long enough, the adjust signal 272 will not remain asserted long enough to reset the DFF 242 and preset the DFF 240. Thus, the adjust signal 272 will not remain asserted for a long enough period to cause the PFD 210 reversion to the pump-down mode. Accordingly, timing considerations are an important aspect of the present invention.

Figure 5:
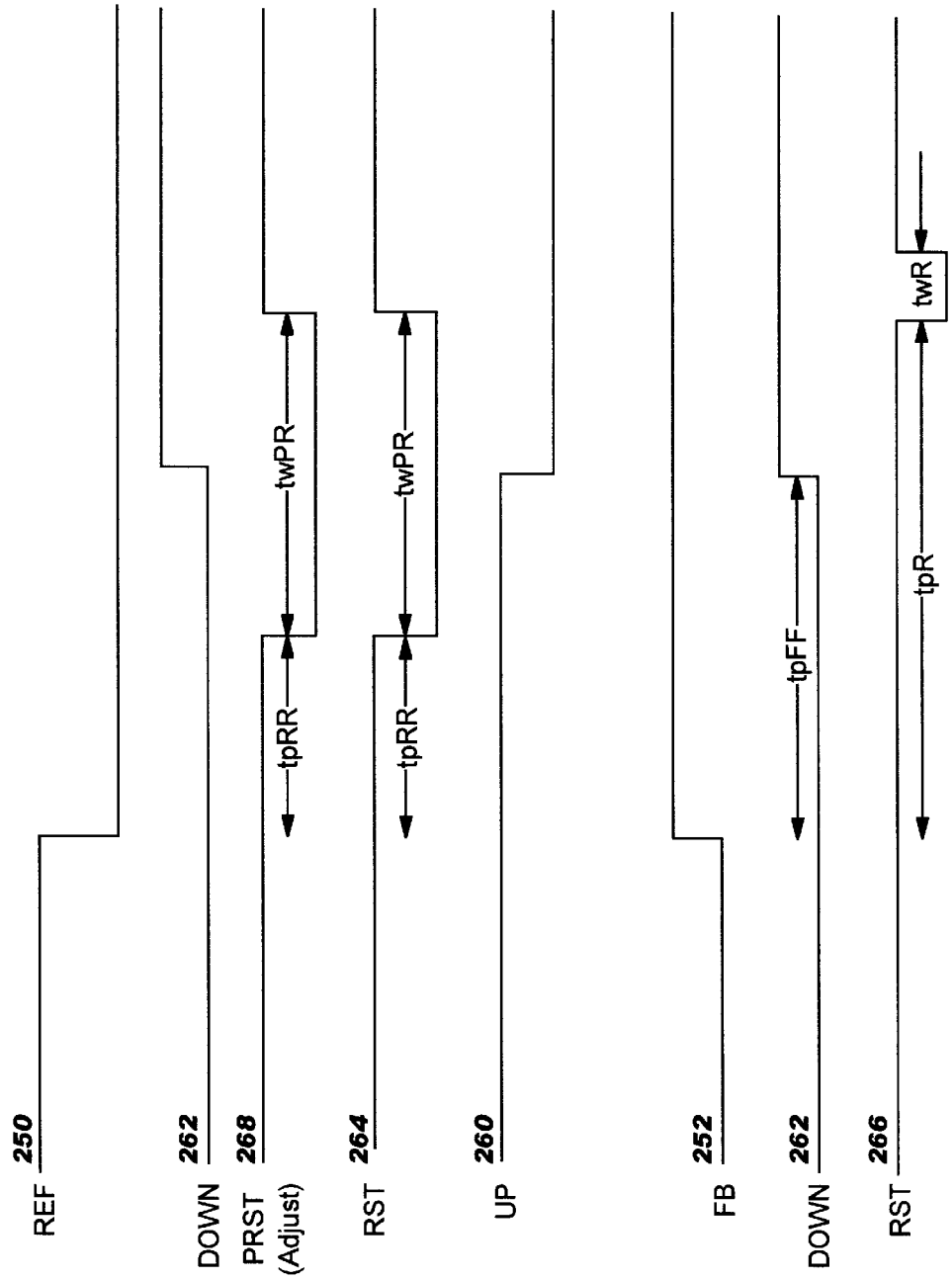
FIG. 5 is a timing diagram illustrating timing constraints in relation to signal propagation delays during the PFD correction.

FIG. 5 is a timing diagram illustrating the timing constraints in relation to the signal propagation delays during a PFD behavior correction. Referring now to FIGS. 3 and 5 together, the timing constraints are at their extreme when the falling edge 402 of the REF signal 250 is coincidental with the rising edge 442 of the FB 252. Before correction begins, the Up control signal 260 is asserted (logic "1") and the Down control signal 262 is negated (logic "0"). Upon the falling edge 402 of the REF signal 250, the adjust signal 272 is asserted. In turn, the preset signal (PRST) 268 is asserted after a propagation delay (tpPR) determined (in this configuration) by the DFF 222 and the NOR 236. As a result, the Down control signal 262 is then asserted and the Up control signal 260 is then negated. The pulse width (twPR) of the PRST signal 268 is determined by the preset delay (provided by the delay buffer 226).

The rising edge 442 of the FB signal 252, at the same time as the falling edge 402 of the REF signal 250, causes the Down control signal 262 to be asserted after a typical DFF 240 propagation delay (tpFF). The RST signal pulse width (twR) is determined by the reset delay (provided by the delay buffer 230). If preset delay is too short relative to the reset delay (hence the Up control signal 260 has not yet been negated), the reset of the DFFs 240 and 242 and in turn, the negation of the UP and Down control signals 260 and 262 may override the preset and the assertion of the Down control signal 262. This in turn will defeat the correction of the PFD 210.

Accordingly, a proper relationship between the preset delay and the other delays—the reset delay and propagation delays—must be achieved based on the timing constraints (as illustrated in FIG. 5 regarding the DLL 200 in FIG. 3). This relationship is expressed in the following set of equations and inequality, wherein the set of equations is derived from the DLL 200 configuration and the inequality describes the timing constraints. Finally, using these equations, the inequality is solved for the preset delay order to determine the preset delay provided by the delay buffer 226.

THE SET OF EQUATIONS

A propagation delay time (tpPR) from the REF signal 250 falling edge to the preset of DFF 240 is:

$$tpPR = tpFF + tpNOR$$

where PR is the preset, FF is the DFF 222, and tpNOR is the propagation delay through the NOR gate 236.

The preset pulse width (twPR) is:

$$twPR = D2 + tpRST$$

where D2 is the preset delay provided by the delay buffer 226, and tpRST is the time to reset the DFF 222.

A delay time (tpR) from the falling edge 402 of the REF signal 250 and the (coincidental) rising edge 442 of the FB signal 252 to the reset of the DFFs 240 and 242 is:

$$tpR = tpFF + tpAND + D1 + tpAND + tpNOR$$

where D1 is the delay provided by the delay buffer 230, and tpAND is the propagation delay through the AND gates 228 and 232.

The RST signals 264 and 266 respective pulse widths (twR) is:

$$twR = tpRST + tpAND + tpAND + tpNOR$$

where tpRST is the time to reset each of the DFFs 240 and 242 (assuming all have the same delay).

A time period (t1) between the falling edge 402 of the REF signal 250 to the PRST signal 268 rising edge is:

$$t1 = tpPR + twPR.$$

A duration (t2) between the rising edge 442 of the FB signal 252 and the RST signal 266 rising edge is:

$$t2 = tpR + twR.$$

THE INEQUALITY

Hence, to ensure that the preset is longer than the reset, the following inequality which describes this timing constraints (as explained above) must be true:

$$tpPR + twPR > tpR + twR$$

RESOLVING THE INEQUALITY FOR THE PRESET DELAY

Therefore, substituting the above equations with the terms of the inequality (assuming equal delay in similar components) and solving the inequality for the preset delay by extracting D2 in order to determine the preset delay produces:

$$D2 > D1 + 4tpAND + tpNOR$$

If this inequality is satisfied, than the rising edge of the FB signal 252 can occur anywhere within the REF signal 250 period without degrading the PFD 210 correction functionality.

One of ordinary skill in the art will recognize that different embodiments of the present invention may be configured differently and may utilize different components. Therefore it should be understood the different embodiments may produce a different set of equations without departing from the scope and spirit of the present invention.

CONCLUSION

A delay-locked loop with a phase-frequency detector monitor circuit has been disclosed. Although the present invention has been described in accordance with the embodiments shown, one of ordinary skill in the art will readily recognize that there could be variations to the embodiments and those variations would be within the spirit and scope of the present invention. For example, as stated above, it should be understood that different embodiments may utilize different or equivalent components to construct the DLL 200 without departing from the scope and spirit of the present invention. Moreover, different embodiments may utilize different topologies in forming the DLL 200. Therefore, one of ordinary skill in the art will recognize that such variations may require an adjustment of the preset delay in accordance with the foregoing principles. This adjustment is within the scope and spirit of the present invention. Accordingly, many modifications may be made by one of ordinary skill in the art without departing from the spirit and scope of the appended claims.

What is claimed is:

1. A delay-locked loop, comprising:
a phase frequency detector, the phase frequency detector including a state machine having a first input for receiving a reference signal and a second input for receiving a feedback signal, wherein the phase frequency detector resets the state machine in response to a rising edge of a lagging signal between the reference signal and the feedback signal;
a charge pump coupled to the phase frequency detector;
a loop filter coupled to the charge pump and the phase frequency detector;
delay line means coupled to the charge pump and the loop filter, the delay line means providing the feedback signal to the phase frequency detector; and
monitor means coupled to the phase frequency detector, the charge pump and the loop filter, the monitor means for detecting when a voltage across the loop filter is at a predetermined level, wherein when the voltage is at the predetermined level the monitor means causes the phase frequency detector to enter a pump-down mode until the feedback signal is aligned with the reference signal.

2. The delay-locked loop of claim 1, wherein the reference signal is a reference clock signal.

3. The delay-locked loop of claim 2, wherein the feedback signal is a feedback clock signal.

4. The delay-locked loop of claim 1, wherein the predetermined level is above a reference voltage level.

5. The delay locked loop of claim 1, wherein the monitor means includes a detector for providing a signal indicating the stuck condition.

6. The delay locked loop of claim 5, wherein the detector comprises a comparator.

7. The delay locked loop of claim 6, wherein the monitor means further includes a flip-flop coupled to the comparator for receiving the signal from the comparator, the flip-flop providing a preset signal to the phase frequency detector, the preset signal for causing the phase frequency detector to enter the pump-down mode.

8. The delay locked loop of claim 7, wherein the monitor means further includes a preset delay means coupled to the flip-flop for providing a preset delay and determining a pulse width of the preset signal.

9. A delay-locked loop, comprising:
   a phase frequency detector, the phase frequency detector including a state machine having a first input for receiving a reference clock signal and a second input for receiving a feedback clock signal, wherein the phase frequency detector resets the state machine in response to a rising edge of a lagging signal between the reference clock signal and the feedback clock signal;
   a charge pump coupled to the phase frequency detector;
   a capacitor coupled to the charge pump and the phase frequency detector;
   a voltage controlled delay line coupled to the charge pump and the capacitor, the voltage controlled delay line providing the feedback clock signal to the phase frequency detector; and
   monitor means coupled to the phase frequency detector, the charge pump and the capacitor, the monitor means for detecting when a voltage across the capacitor is at a predetermined level, wherein when the voltage is at the predetermined level the monitor means causes the phase frequency detector to enter a pump-down mode until the feedback clock signal is aligned with the reference clock signal.

10. A delay-locked loop, comprising:
    a charge pump;
    a phase frequency detector coupled to the charge pump, the phase frequency detector for receiving a reference signal, the phase frequency detector including: means for providing a reset delay coupled between the charge pump and a state machine, the state machine being further coupled to the charge pump for controlling the charge pump, the state machine including a first input and a second input, the first input and the second input receiving the reference signal and a feedback signal, respectively, wherein upon lapse of the reset delay the phase frequency detector resets the state machine in response to a rising edge of a lagging signal between the reference signal and the feedback signal;
    a loop filter coupled to the charge pump and the phase frequency detector;
    delay line means coupled to the charge pump and the loop filter, the delay line means providing the feedback signal to the phase frequency detector, wherein the phase frequency detector compares the feedback signal with the reference signal; and
    monitor means coupled to the phase frequency detector, the charge pump and the loop filter, the monitor means for detecting when a voltage across the loop filter is at a predetermined level, wherein when the voltage is at the predetermined level the monitor means causes the phase frequency detector to enter a pump-down mode until the feedback signal is aligned with the reference signal, the monitor means, the monitor means including
    a comparator for providing a signal based upon a level of the voltage across the loop filter and the predetermined level;
    a flip-flop coupled to the comparator for receiving a signal from the comparator indicating a stuck condition; and
    means for providing a preset delay coupled to the flip-flop for delaying the resetting of the flip-flop based upon the preset delay.

11. The delay locked loop of claim 10, wherein the state machine is for providing an up control signal and a down control signal, wherein the phase frequency detector enters one of the pump-down mode and the pump-up mode upon assertion of one of the up control signal and the down control signal, respectively, and wherein the resetting of the state machine negates the up control signal and the down control signal.

12. The delay locked loop of claim 11, wherein the state machine further includes a p air of flip-flops coupled to the reset delay means.

13. The delay locked loop of claim 12, wherein the reset delay means further comprises a combinational logic coupled between the state machine and the charge pump.

14. The delay locked loop of claim 13, wherein the combinational logic includes delay means;
    a pair of dual input AND gates coupled to the delay means; and
    a pair of dual input NOR gates coupled to the pair of dual input AND gates, wherein the combinational logic provides the a reset signal for resetting the state machine, and wherein the preset delay is determined in relation to the reset delay and a plurality of predetermined propagation delays.

15. The delay locked loop of claim 14, wherein the plurality of predetermined propagation delays include a delay provided by each of the state machine, the flip-flop and the reset delay means.

16. The delay locked loop of claim 14, wherein the preset delay is longer than the reset delay for preventing the resetting of the state machine from overriding a presetting of the state machine.

17. The delay locked loop of claim 10, in which the monitor means provides a preset signal to the phase frequency detector for allowing the phase frequency detector to enter the pump-down mode, wherein the preset signal is synchronized with a falling edge of the reference signal.

18. The delay locked loop of claim 10, wherein the loop filter comprises a capacitor.

19. The delay locked loop of claim 18, wherein the capacitor is charged initially to a voltage that is higher then zero volts.

* * * * *